US007331420B2

(12) United States Patent

Sasaki et al.

(10) Patent No.: US 7,331,420 B2

(45) Date of Patent: Feb. 19, 2008

(54) FRAME FOR SPEAKER DEVICE AND SPEAKER DEVICE

(75) Inventors: Hiromitsu Sasaki, Yamagata (JP); Yutaka Moriyama, Yamagata (JP); Eiji Sakaguchi, Saitama (JP); Hidehito Oki, Saitama (JP)

(73) Assignees: Pioneer Corporation, Tokyo (JP); Toroku Pioneer Corporation, Yamagata (JP); Honda Motor Co., Ltd., Tokyo (JP)

( * ) Notice: Subject to any disclaimer, the term of this patent is extended or adjusted under 35 U.S.C. 154(b) by 145 days.

(21) Appl. No.: 11/354,999

(22) Filed: Feb. 16, 2006

(65) Prior Publication Data

US 2006/0188124 A1 Aug. 24, 2006

(51) Int. Cl.

| | |
|---|---|
| ***H05K 5/02*** | (2006.01) |
| ***H04R 9/04*** | (2006.01) |
| ***H04R 9/02*** | (2006.01) |
| *H04R 1/02* | (2006.01) |
| *H04R 9/06* | (2006.01) |
| *H04R 11/02* | (2006.01) |

(52) U.S. Cl. ....................... 181/148; 381/395; 381/433

(58) Field of Classification Search ................ 181/150, 181/148, 171; 381/302, 86, 386, 389, 395, 381/433

See application file for complete search history.

(56) References Cited

U.S. PATENT DOCUMENTS

| | | | | |
|---|---|---|---|---|
| 2,611,830 | A * | 9/1952 | Heineman | 381/189 |
| 5,566,242 | A * | 10/1996 | Hall | 381/423 |
| 6,675,930 | B2 * | 1/2004 | Sugiyama et al. | 181/148 |
| 6,731,773 | B1 * | 5/2004 | Bergbower et al. | 381/397 |
| 6,763,120 | B2 * | 7/2004 | Sugiyama et al. | 381/395 |
| 7,031,490 | B2 * | 4/2006 | Stompler | 381/433 |
| 7,164,777 | B1 * | 1/2007 | Stompler | 381/433 |
| 7,184,568 | B2 * | 2/2007 | Chan | 381/433 |

FOREIGN PATENT DOCUMENTS

| | | |
|---|---|---|
| JP | 05-347795 | 12/1993 |
| JP | 07-38992 | 2/1995 |
| JP | 08-070495 | 3/1996 |
| JP | 2004-312338 | 11/2004 |

* cited by examiner

*Primary Examiner*—Edgardo San Martin

(74) *Attorney, Agent, or Firm*—Young & Thompson

(57) ABSTRACT

A frame for a speaker device includes a magnetic circuit housing unit which houses a magnetic circuit, a substantially annular outer peripheral portion which is arranged on an outer side of the magnetic circuit housing unit, and plural arm portions which connect the magnetic circuit housing unit and the outer peripheral portion. Each of the plural arm portions has a sectional shape of a one-open-end shape having a connected end and an open end, and the plural arm portions include an arm portion having the open end oriented to one direction and an arm portion having the open end oriented to a direction opposite to the one direction.

4 Claims, 6 Drawing Sheets

100

FRAME FOR SPEAKER DEVICE AND SPEAKER DEVICE

BACKGROUND OF THE INVENTION

1. Field of the Invention

The present invention relates to a configuration of a frame for a speaker device.

2. Description of Related Art

Conventionally, there is known a speaker device including a vibrating system having a frame and a diaphragm, and a magnetic circuit system having a yoke, a magnet and a plate.

In such a speaker device, the frame is formed into a bowl shape, for example. The frame having such a shape includes a frame central portion holding a magnetic circuit, an outer peripheral portion disposed on an outer side of the frame central portion and having an edge mounting portion on which an outer peripheral portion of an edge is mounted, and plural arm portions connecting the frame central portion and the outer peripheral portion.

Particularly, on the frame having such a configuration, the plural arm portions are provided to radially extend from a center of the frame to the outer peripheral portion. Examples of the frame having the configuration of this kind are disclosed in Japanese Patent Applications Laid-open under No. 7-38992, No. 2004-312338, No. 8-70495 and No. 5-347795.

In the speaker device according to the above-mentioned documents, the arm connecting the frame central portion and the outer peripheral portion is mainly designed for the purpose of securing mechanical strength. The arm in which ribs for securing the strength are formed on both edges of a plate is frequently used, and a sectional shape thereof is formed into an "H" or "η" shape. However, since the arm having the "H" or "η" shaped sectional shape includes a plane surface, a resistance to an air flow is large on an flat portion thereof. Therefore, it is problematic that the resistance to the air flow in both directions between the frame central portion and the outer peripheral portion easily becomes unequal at the time of the driving of the speaker.

SUMMARY OF THE INVENTION

The present invention has been achieved in order to solve the above problem. It is an object of this invention to provide a frame for a speaker device and a speaker device using the frame capable of equalizing a resistance of an arm portion to an air flow in the vicinity of a frame at a time of driving of a speaker to smoothly drive the speaker.

According to one aspect of the present invention, there is provided a frame for a speaker device including: a magnetic circuit housing unit which houses a magnetic circuit; a substantially annular outer peripheral portion which is arranged on an outer side of the magnetic circuit housing unit; and plural arm portions which connect the magnetic circuit housing unit and the outer peripheral portion, wherein each of the plural arm portions has a sectional shape of a one-open-end shape having a connected end and an open end, and wherein the plural arm portions include an arm portion having the open end oriented to one direction and an arm portion having the open end oriented to a direction opposite to the one direction.

On the above-mentioned frame for the speaker, the plural arm portions are provided between the magnetic circuit housing unit corresponding to a central portion of the frame and the outer peripheral portion. Each of the arm portions has the sectional shape of the one-open-end shape having the connected end and the open end to have the air resistance to some extent to the air flow from the side of the open end. However, it has the small air resistance to the air flow from the connected end side. Therefore, some arm portions have the open ends oriented to the one direction, and some arm portions have the open ends oriented to the direction opposite to the one direction. Thereby, the air resistance of all the arm portions to the air flow from the front side (sound output side) of the speaker device to the rear side thereof, and the air flow from the rear side to the front side, i.e., the air resistance of the whole frame, can be equalized. Therefore, it can be prevented that the air flow in the front to rear direction of the speaker device becomes unequal and thereby an adverse effect is given to vibration of the diaphragm. In a preferred example, the sectional shape of the one-open-end shape may be a substantially U-shaped or V-shaped sectional shape.

In a manner of the above frame, a number of arm portions having the open ends oriented to the one direction may be substantially equal to a number of arm portions having the open ends oriented to the opposite direction among the plural arm portions. Thereby, it becomes possible to more accurately equalize the resistance to the air flow in the front-rear direction of the speaker device.

According to another aspect of the present invention, there is provided a speaker device including a frame, the frame including: a magnetic circuit housing unit which houses a magnetic circuit; a substantially annular outer peripheral portion which is arranged on an outer side of the magnetic circuit housing unit; and plural arm portions which connect the magnetic circuit housing unit and the outer peripheral portion, wherein each of the plural arm portions has a sectional shape of a one-open-end shape having a connected end and an open end, and wherein the plural arm portions include an arm portion having the open end oriented to one direction and an arm portion having the open end oriented to a direction opposite to the one direction.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

The preferred embodiments of the present invention will now be described below with reference to the attached drawings.

[Configuration of Speaker Device]

First, a description will be given of a configuration of a speaker device 100 according to an embodiment of the present invention with reference to FIG. 1 to FIG. 5.

Figure 1:
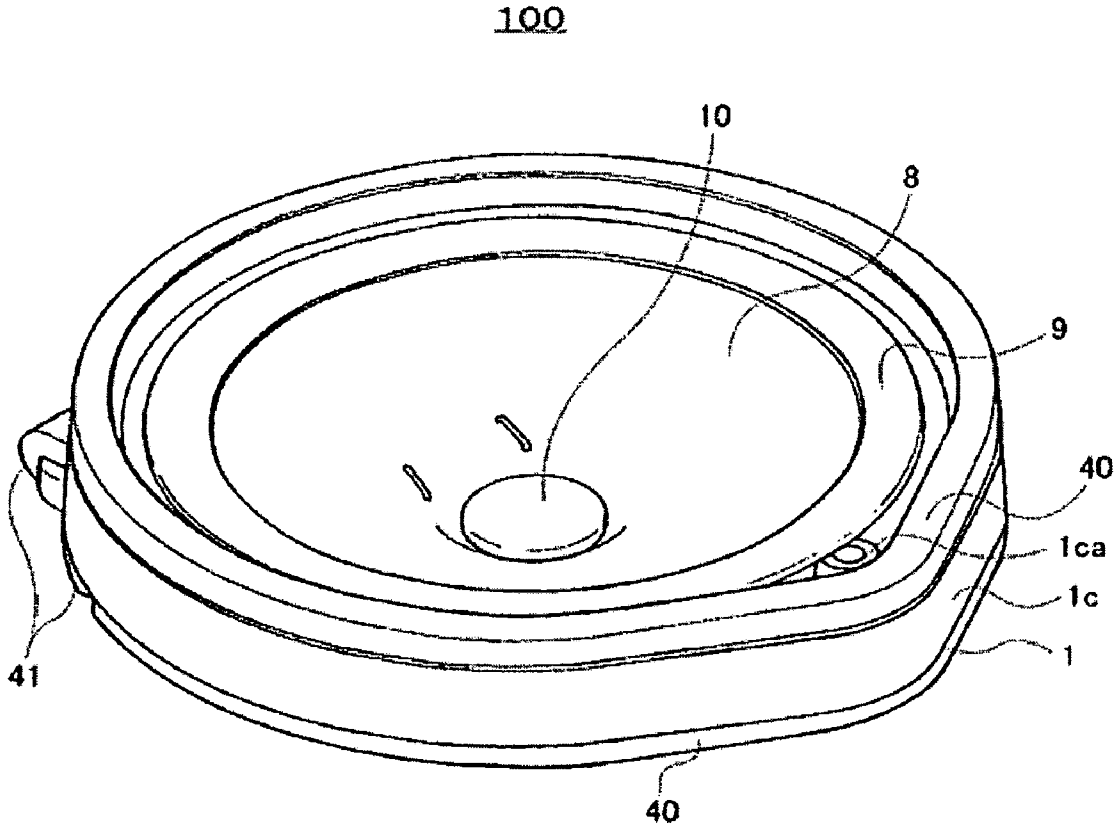
FIG. 1 shows a perspective view of a speaker device according to an embodiment of the present invention when observed from a sound output side.
Figure 2:
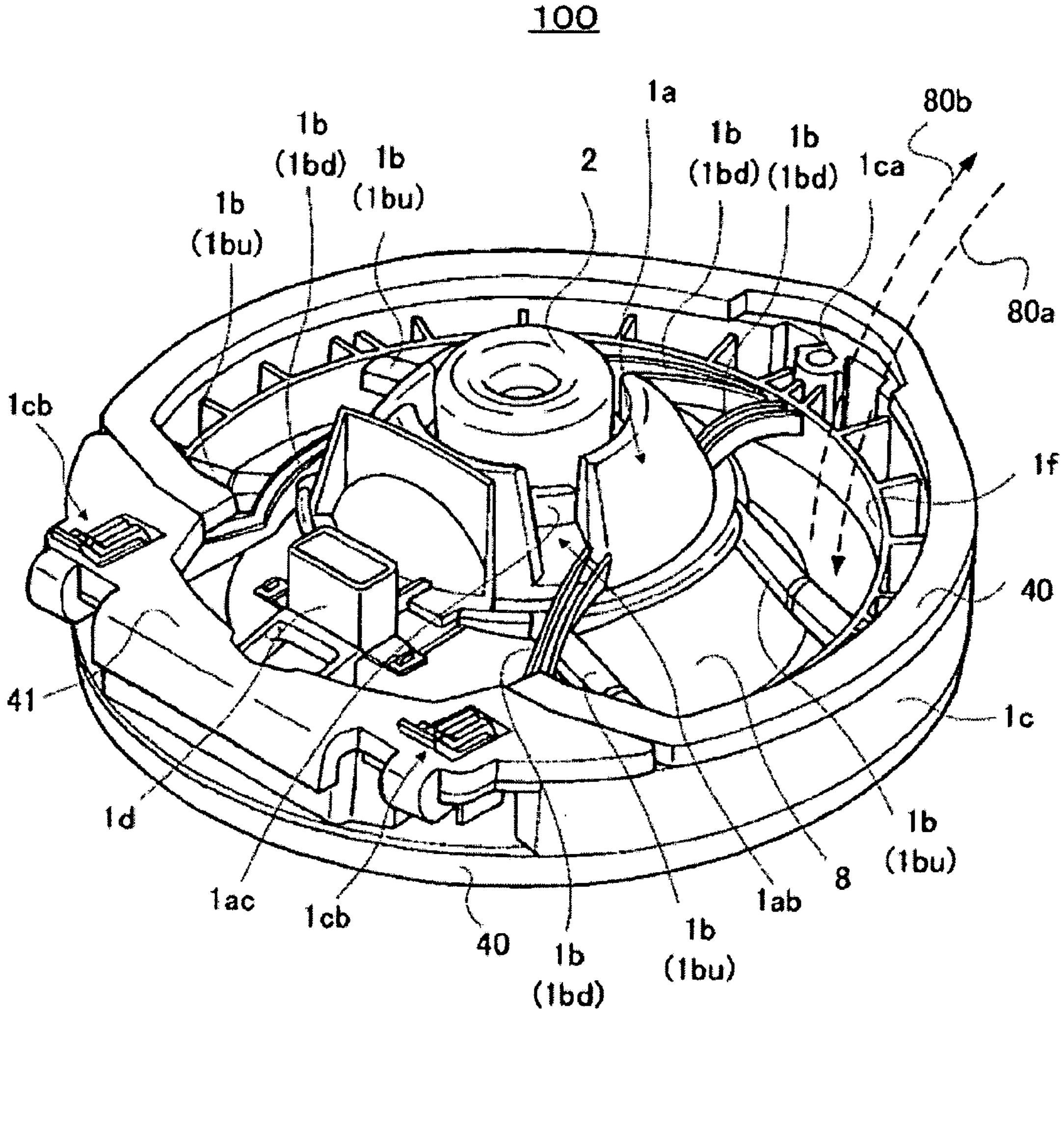
FIG. 2 shows a perspective view of the speaker device according to the embodiment when observed from a side opposite to the sound output side.
Figure 3:
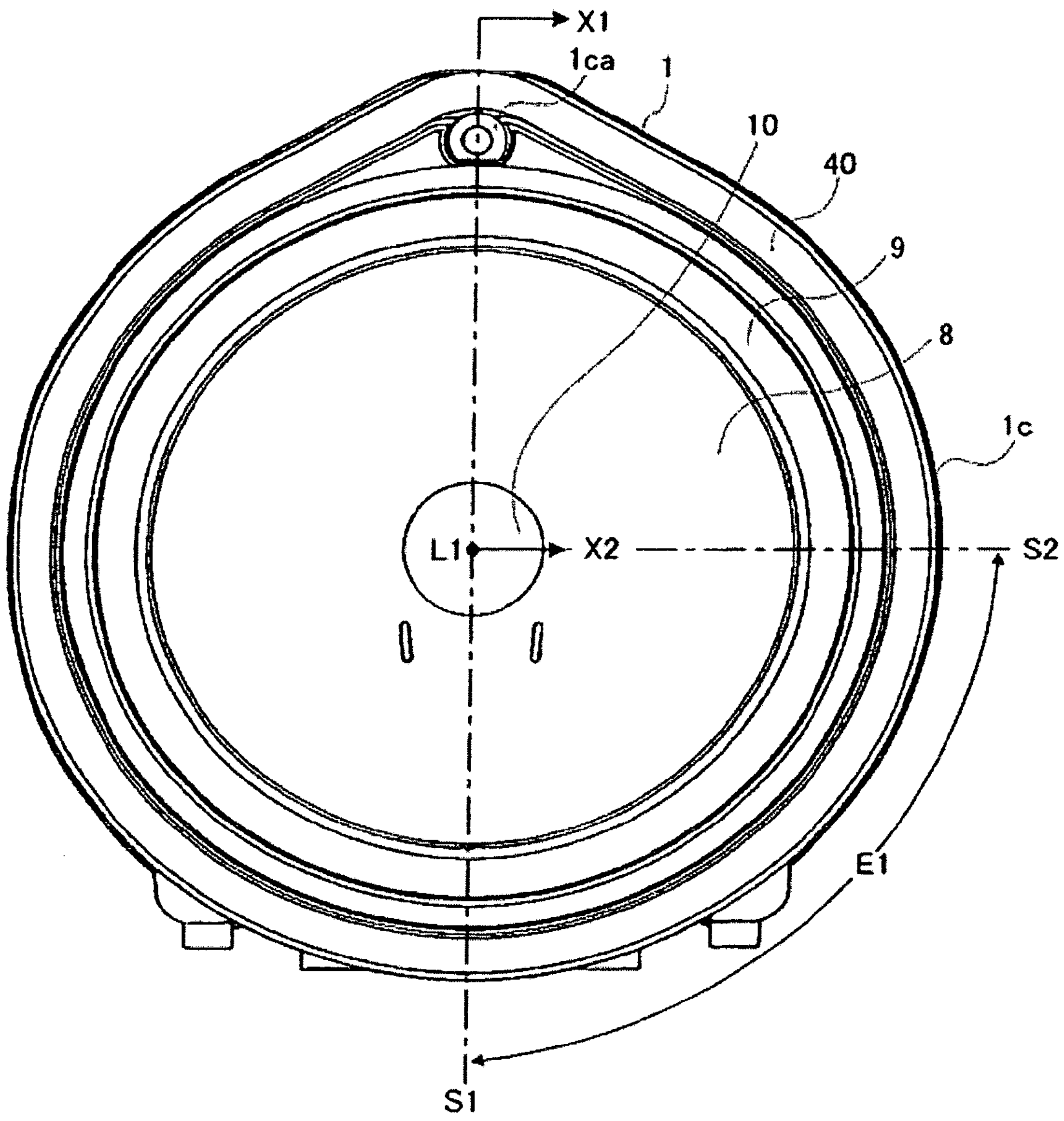
FIG. 3 shows a front view of the speaker device according to the embodiment.
Figure 4:
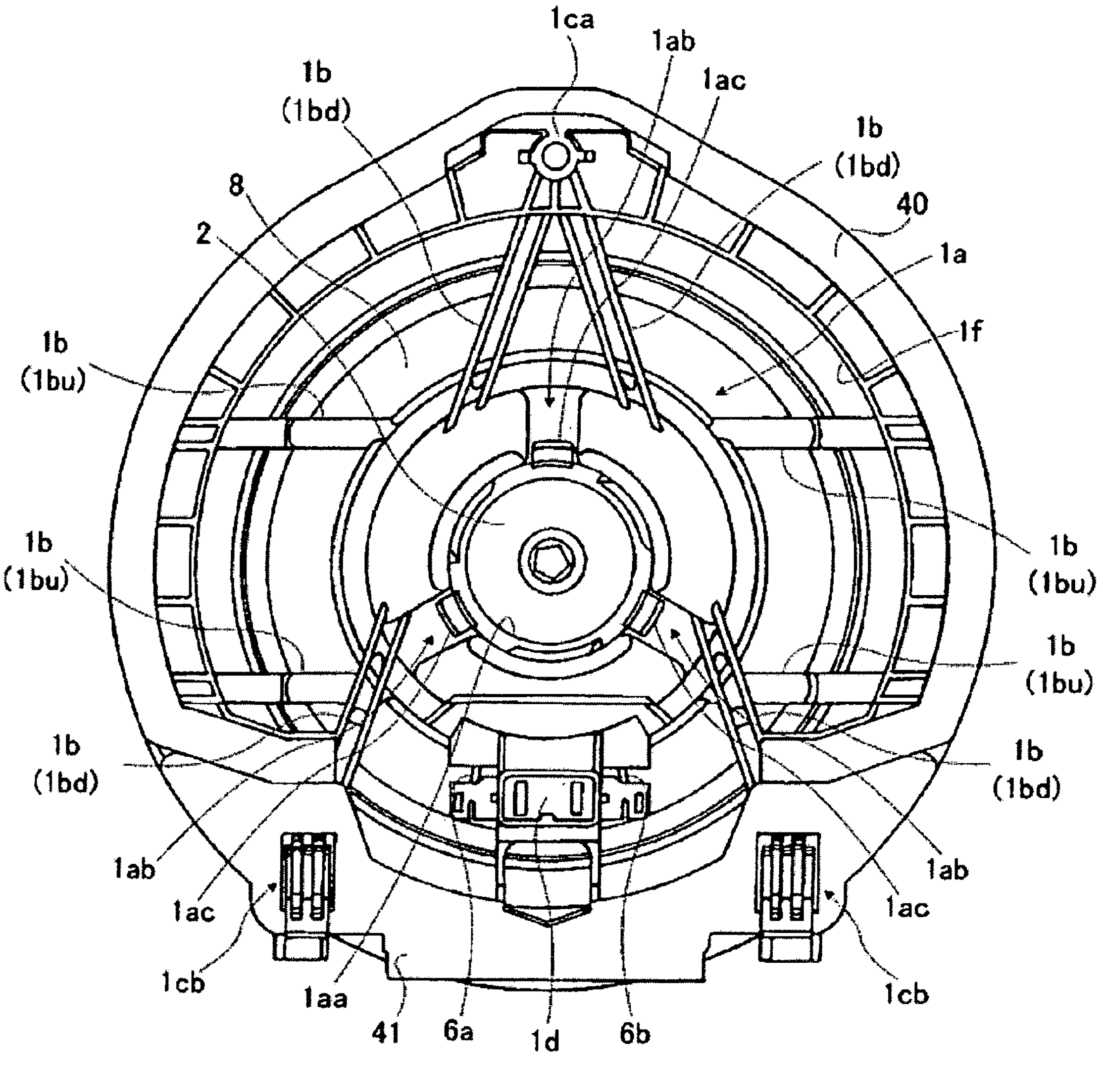
FIG. 4 shows a rear view of the speaker device according to the embodiment.
Figure 5:
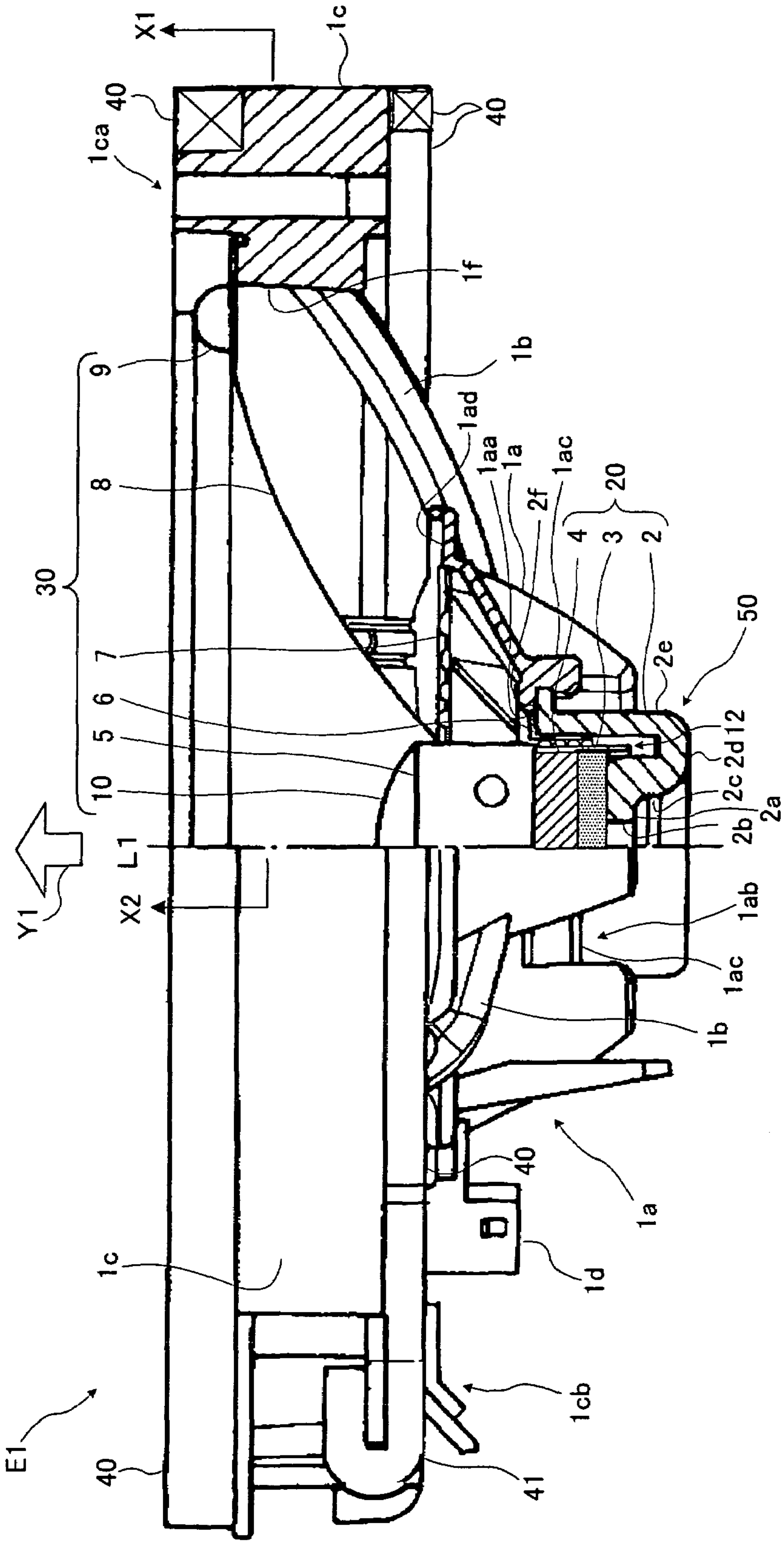
FIG. 5 shows a one-side sectional view and a one-side side view of the speaker device according to the embodiment.

FIG. 1 shows a perspective view of the speaker device 100 according to an embodiment of the present invention in a case that it is observed from its sound output side. FIG. 2 shows a perspective view of the speaker device 100 in a case that it is observed from a side opposite to the sound output side, i.e., from a rear side. FIG. 3 shows a front view of the speaker device 100 in the case that it is observed from the sound output side. FIG. 4 shows a rear view of the speaker device 100 in the case that it is observed from the side opposite to the sound output side, i.e., from the rear side. FIG. 5 shows a sectional view of the speaker device 100 on the right side of the drawing with respect to a central axis L1 of the speaker device 100 (or a frame 1) and a side view of the speaker device 100 on the left side of the drawing with respect to the central axis L1, respectively. In addition, the sectional view shown on the right side of FIG. 5 is a sectional view taken along the cutting-plane line X1-X2 of the speaker device 100 shown in FIG. 3. The side view shown on the left side of FIG. 5 corresponds to a side surface portion E1 of the speaker device 100 between a plane surface S1 passing through the central axis L1 of the speaker device 100 and a plane surface S2 passing through the central axis L1 and perpendicular to the plane surface S1 in FIG. 3.

The speaker device 100 according to this embodiment can be preferably used as an on-vehicle speaker device. The speaker device 100 is configured by mounting a speaker unit 50 onto the frame 1.

The speaker unit 50 includes a magnetic circuit system 20 having a yoke 2, a magnet 3 and a plate 4, and a vibrating system 30 having a voice coil bobbin 5, a voice coil 6, a damper 7, a diaphragm 8, an edge 9 and a cap 10.

First, each component of the magnetic circuit system 20 will be explained.

The magnetic circuit system 20 is configured as an internal magnet type magnetic circuit.

The yoke 2 is formed into a substantial pot shape. The yoke 2 has a first flat portion 2*a* for supporting a disc-shape magnet 3, an opening 2*b* formed at a substantial center of the first flat portion 2*a*, a first cylindrical portion 2*c* connected to an outer peripheral portion of the first flat portion 2*a*, a second flat portion 2*d* connected to a lower end portion of the first cylindrical portion 2*c*, a second cylindrical portion 2*e* connected to an outer peripheral portion of the second flat portion 2*d* and a flange portion 2*f* connected to an upper end portion of the second cylindrical portion 2*e* and outwardly extending from the upper end portion. Each of the components is integrally formed.

An upper surface of the first flat portion 2*a* has flatness. The opening 2*b* has a function of radiating a heat generated in the magnetic circuit system 20 to the outside. The first cylindrical portion 2*c* is formed into a cylindrical shape. In FIG. 5, by forming the first cylindrical portion 2*c* to have a predetermined length in the direction of an arrow Y1, a relative positional relation of components of the vibrating system 30 with respect to the magnet 3 and the plate 4 can be adjusted. A lower surface of the second flat portion 2*d* has flatness. The second flat portion 2*d* has a function of forming a constant gap between the first cylindrical portion 2*c* and the second cylindrical portion 2*e*. The second cylindrical portion 2*e* is formed into a cylindrical shape and is provided on the outer side of the first cylindrical portion 2*c*. The second cylindrical portion 2*e* has a function of forming a magnetic gap 12 between an inner peripheral wall of the second cylindrical portion 2*e* and each of the outer peripheral walls of the magnet 3 and the plate 4. The flange portion 2*f* is fixed to a magnetic circuit housing unit 1*a* being a component of the frame 1. By mounting the flange portion 2*f* onto the magnetic circuit housing unit 1*a*, the magnetic circuit system 20 can be housed in the magnetic circuit housing unit 1*a*.

The magnet 3 is formed into a disc shape and is mounted onto the first flat portion 2*a* of the yoke 2. On the magnet 3, the disc-shape plate 4 having the substantially same diameter as the magnet 3 is mounted.

In the magnetic circuit system 20 having such a configuration, the magnet 3 and the plate 4 configure the magnetic circuit, and magnetic flux of the magnet 3 is concentrated on the magnetic gap 12 formed between the outer peripheral wall of the plate 4 and the inner peripheral wall of the second cylindrical portion 2*e*.

Next, each component of the vibrating system 30 will be explained.

The voice coil bobbin 5 is formed into a substantially cylindrical shape. The voice coil 6 which will be explained later is wound around the vicinity of the lower end portion of the outer peripheral wall of the voice coil bobbin 5. The vicinity of the lower end portion of the inner peripheral wall of the voice coil bobbin 5 is opposite to each of the outer peripheral walls of the magnet 3 and the plate 4 with constant spaces therebetween. Meanwhile, the vicinity of the lower end portion of the outer peripheral wall of the voice coil bobbin 5 is opposite to the vicinity of the upper end portion of the inner peripheral wall of the second cylindrical portion 2*e* being the component of the yoke 2 with a constant space therebetween. A gap (magnetic gap 12) is formed between the inner peripheral wall of the second cylindrical portion 2*e* and the outer peripheral wall of the plate 4.

The voice coil 6 has one wiring, which includes a plus lead wire 6*a* and a minus lead wire 6*b* as shown in FIG. 4. The plus lead wire 6*a* is an input wiring for an L (or R)-channel signal, and the minus leadwire 6*b* is an input wiring for a ground (GND:ground) signal. The lead wires 6*a* and 6*b* are electrically connected to a terminal 1*d* provided on the frame 1. In addition, the terminal 1*d* is electrically connected to a wiring on an output side of an amplifier (not shown). Thereby, the signal and the power of one channel are inputted to the voice coil 6 from the amplifier side via the terminal 1*d* and the lead wires 6*a* and 6*b*.

The damper 7 is formed into an annular shape and has an elastic portion on which corrugations are concentrically formed. An inner peripheral edge portion of the damper 7 is mounted onto the vicinity of the upper end portion of the outer peripheral wall of the voice coil bobbin 5. Meanwhile, an outer peripheral edge portion of the damper 7 is mounted onto the outer peripheral portion of the magnetic circuit housing unit 1*a*.

Various kinds of materials such as paper, high polymer and metal can be applied to the diaphragm 8 in accordance with the various use purposes. The diaphragm 8 is formed into a cone shape. An inner peripheral edge portion of the diaphragm 8 is mounted onto the vicinity of the upper end portion of the outer peripheral wall of the voice coil bobbin 5 and onto the upper side of the damper 7. Meanwhile, the outer peripheral edge portion of the diaphragm 8 is mounted onto the inner peripheral edge portion of the annular edge 9. The outer peripheral edge portion of the edge 9 is mounted onto an outer peripheral portion 1*c* of the frame 1. In this example, the diaphragm 8 and the edge 9 are independently formed. However, this invention is not limited to this. Namely, the diaphragm 8 and the edge 9 may be integrally formed.

The cap 10 is formed into a substantial dome shape and is mounted onto the outer peripheral wall of the voice coil bobbin 5 in a manner to cover the upper surface of the voice coil bobbin 5. Thereby, it can be prevented that dust and foreign matter enter the inner side of the speaker unit 50.

The frame 1 is formed with various kinds of materials such as a metal and a resin. For the purpose of lightening the speaker device 100, the frame 1 is preferably formed with a resin material. The frame 1 mainly includes the magnetic circuit housing unit 1*a*, the outer peripheral portion 1*c* arranged on the outer side and the upper side of the magnetic circuit housing unit 1*a*, plural arm portions 1*b* connecting the magnetic circuit housing unit 1*a* and the outer peripheral portion 1*c*, and the terminal 1*d* provided in the vicinity of the outer peripheral portion of the magnetic circuit housing unit 1*a*. Each of the components is integrally formed. In addition, on the frame 1, an opening 1*f* is formed between the magnetic circuit housing unit 1*a* and the outer peripheral portion 1*c*.

The magnetic circuit housing unit 1*a* is formed into a substantial bowl shape and has an opening 1*aa*, cut-out portions lab and plural fixing portions 1*ac*. The diameter of the opening 1*aa* is substantially same as an outside diameter of the second cylindrical portion 2*e* of the yoke 2. When the direction of the central axis L1 of the speaker device 100 is prescribed as the vertical direction in FIG. 5, the opening 1*aa* is formed at a position corresponding to the substantial center of the vertical direction of the magnetic circuit housing unit 1*a*. Each of the cut-out portions lab is formed by removing a part of the outer peripheral wall of the magnetic circuit housing unit 1*a*, and it is formed in the vicinity of the outer peripheral wall thereof with proper spaces therebetween. Each of the fixing portions 1*ac* is formed in the vicinity of the opening 1*aa* and at a position corresponding to the cut-out portion 1*ab*. In addition, each of the fixing portions 1*ac* is formed along the circumferential direction of the opening 1*aa* with proper spaces therebetween.

One end of each arm portion 1*b* is mounted onto the outer peripheral wall of the magnetic circuit housing unit 1*a*, and the other end thereof is attached to the inner peripheral wall of the outer peripheral portion 1*c*.

The outer peripheral portion 1*c* is formed into a substantially annular shape, and is provided on the outer side of the magnetic circuit housing unit 1*a* and the plural arm portions 1*b*. The outer peripheral portion of the edge 9 and cushion members 40 and 41 are mounted onto the outer peripheral portion 1*c*. The outer peripheral portion 1*c* has mounting portions 1*ca* and 1*cb* for mounting the speaker device 100 onto the mounting base such as an inner panel of the vehicle door, for example.

The mounting portion 1*ca* is an inserting hole into which a bolt is inserted, and is provided at the position opposite to the terminal 1*d* at the outer peripheral portion 1*c*. The mounting portions 1*cb* are formed into a claw shape, and they are provided at the position opposite to the mounting portion 1*ca* on the lower surface side of the outer peripheral portion 1*c* and in the vicinity of the terminal 1*d*. In addition, the one mounting portion 1*cb* and the other mounting portion 1*cb* are provided on the lower surface side of the outer peripheral portion 1*c* with a constant space therebetween.

To the upper surface of the outer peripheral portion 1*c* and a part of the lower surface of the outer peripheral portion 1*c*, a cushion member 40 having a cushion property and formed into a stick shape are attached in a state deformed into a substantial circle shape. As the cushion member 40, a member having an elastic property such as sponge and urethane is preferable, for example. In addition, to the other part of the lower surface of the outer peripheral portion 1*c* on the side of the plural mounting portions 1*cb*, a cushion member 41 formed with the same member as the cushion member 40 and formed into a shape shown in FIG. 5 is attached. Onto one surface of each of the cushion members 40 and 41, a seal having an adhesive property is printed or an adhesive is applied.

The above-mentioned speaker unit 50 is mounted onto the frame 1 in a manner which will be explained below. In FIG. 5, the voice coil bobbin 5 and the cap 10 being the components of the vibrating system 30 are inserted into the opening 1*aa* of the magnetic circuit housing unit 1*a* from the direction of the arrow Y1, and the upper end portion of the voice coil bobbin 5 and the cap 10 are disposed at the upper portion of the surface on the sound output side of the diaphragm 8. In this state, the flange portion 2*f* being the component of the yoke 2 is fixed to the plural fixing portions 1*ac* provided in the magnetic circuit housing unit 1*a*. In this manner, the speaker unit 50 is mounted onto an appropriate position of the frame 1, and the speaker device 100 is configured.

In the speaker device 100 having the above-mentioned configuration, the signal and power outputted from the amplifier are inputted to the voice coil 6 via the terminal 1*d*, and the lead wires 6*a* and 6*b* of the voice coil 6. Thereby, a driving force occurs to the voice coil 6 in the magnetic gap 12, which vibrates the diaphragm 8 in the direction of the central axis L1 of the speaker device 100 in FIG. 5. In this manner, the speaker device 100 emits an acoustic wave in the direction of the arrow Y1 shown in FIG. 5.

(Configuration of Frame)

Next, a description will be give of the configuration of the frame 1 characterizing the present invention, with reference to FIG. 2, FIG. 4 and FIGS. 6A to 6E. Since the basic configuration of the frame 1 is described above, the components of the frame 1 related to the present invention, i.e., the arm portions 1*b*, will be mainly explained below.

The frame 1 includes the mounting portion 1*ca* and the plural mounting portions 1*cb*, mounted onto the mounting base such as the inner panel of the vehicle door, and the plural arm portions 1*b* connecting the magnetic circuit housing unit 1*a* and the outer peripheral portion 1*c*.

Figure 6A:
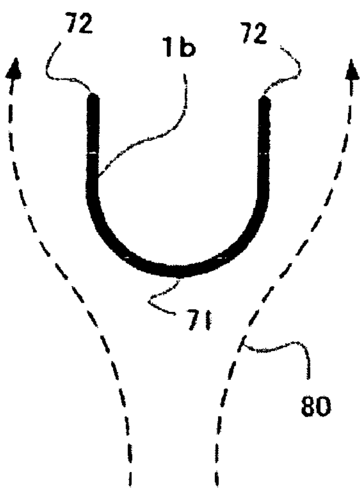
FIGS. 6A to 6E schematically show sectional shapes of arm portions according to the embodiment and another embodiment of the present invention.

As shown in FIG. 2 and FIG. 4, each of the plural arm portions 1*b* has the sectional shape of such a one-open-end shape that one end is connected and another end is open. FIG. 6A schematically shows the sectional shape of the arm portion 1*b*. As shown in FIG. 6A, the arm portion 1*b* has a substantially U-shaped sectional shape. In FIG. 6A, a lower end 71 of the arm portion 1*b* is connected to form the connected end. In addition, upper ends 72 of the arm portion 1*b* are not connected to form the open end. Meanwhile, an air flow 80 in the vicinity of the arm portion 1*b* is shown by a broken-line arrow. The air flow 80 from the connected end 71 of the arm portion 1*b* moves along the outer shape of the arm portion 1*b*. Since the sectional surface of the arm portion 1*b* has no portion perpendicular to the air flow 80, the resistance to the air flow 80 is small and the air smoothly flows in the vicinity of the arm portion 1*b*.

Figure 6B:
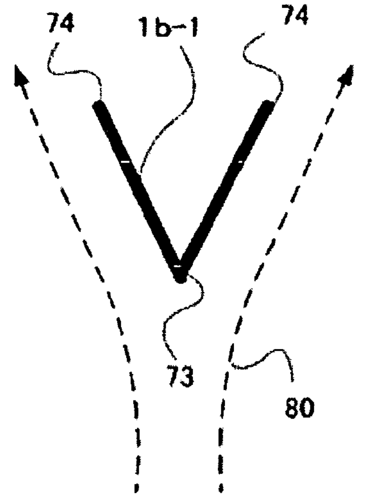
Figure 6C:
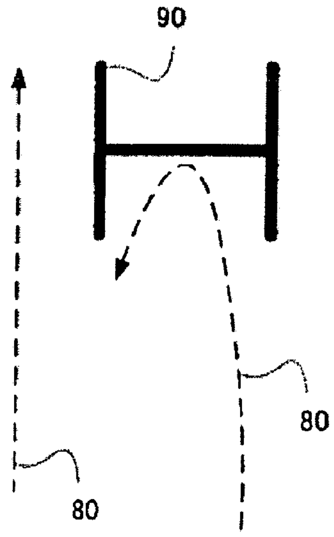
Figure 6D:
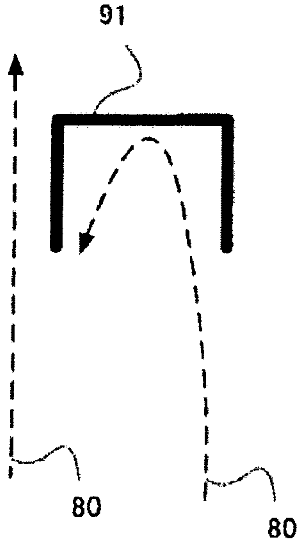
Figure 6E:
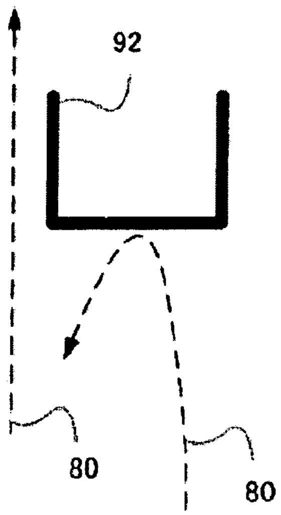

In contrast, since an arm portion 90 having the H-shaped sectional shape shown in FIG. 6C has a surface perpendicular to the air flow, the resistance to the air flow 80 is large. Similarly, since arm portions 91 and 92 having the "η"-shaped sectional shape shown in FIGS. 6D and 6E also have surfaces perpendicular to the air flow, the resistance to the air flow 80 is large.

FIG. 6B schematically shows a sectional shape of an arm portion 1*b*-1 according to a modification of this embodiment. Similarly to the arm portion 1*b*, the arm portion 1*b*-1 according to the modification also has the sectional shape of the one-open-end shape having a connected end 73 and an open ends 74. Since the arm portion 1*b*-1 also has no portion perpendicular to the air flow 80, the resistance of the air flow is small and the air smoothly flows in the vicinity of the arm portion 1*b*-1.

In this manner, since the arm portion of this embodiment has the sectional shape of the one-open-end shape having the connected end and the open end, i.e., the U-shaped or V-shaped sectional shape, the resistance to the air flowing from the connected end can be small.

However, as understood from FIGS. 6A and 6B, the resistances of the arm portions 1*b* and 1*b*-1 to the air flow from the side of the open ends 72 and 74 are not small. Therefore, in this embodiment, by providing the arm portion 1*b* on the frame 1 to make the open ends opposite to each other, the air resistance of the whole frame is equalized. Concretely, as shown in FIG. 2 and FIG. 4, among the plural arm portions 1*b*, the open end of an arm portion 1*bu* is formed in the direction open to the front side (sound output side) of the speaker device, and the open end of an arm portion 1*bd* is formed in the direction open to the rear side of the speaker device. In this manner, by forming the arm portions 1*b* whose open ends are opposite, the resistance of the frame 1 to an air 80*a* flowing from the rear side of the speaker device to the front side thereof and an air 80*b* flowing from the front side to the rear side can be equalized. Thereby, it can be prevented that the air flows in the vicinity of the frame 1 become unequal and thereby the adverse effect is given to the vibration of the diaphragm.

In terms of more accurate equalization of the resistances of the arm portion 1*b* to the air flows 80*a* and 80*b* in both of the directions, it is effective that the number of arm portions 1*bu* whose open ends are oriented to the front side (sound output side) of the speaker device is equal to the number of arm portions 1*bd* whose open ends are oriented to the rear side.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2005-040052 filed on Feb. 17, 2005 including the specification, claims, drawings and summary is incorporated herein by reference in its entirety.

What is claimed is:

1. A frame for a speaker device comprising:

a magnetic circuit housing unit which houses a magnetic circuit;

a substantially annular outer peripheral portion which is arranged on an outer side of the magnetic circuit housing unit; and plural arm portions which connect the magnetic circuit housing unit and the outer peripheral portion, wherein each of the plural arm portions has a sectional shape of a one-open-end shape having a connected end and an open end, and wherein the plural arm portions include an arm portion having the open end oriented in one direction and an arm portion having the open end oriented in a direction opposite to the one direction.

2. The frame for the speaker device according to claim 1, wherein the sectional shape of the one-open-end shape is a substantially U-shaped or V-shaped sectional shape.

3. The frame for the speaker device according to claim 1, wherein a number of arm portions having the open ends oriented to the one direction is substantially equal to a number of arm portions having the open ends oriented to the opposite direction among the plural arm portions.

4. A speaker device comprising a frame, the frame comprising:

a magnetic circuit housing unit which houses a magnetic circuit;

a substantially annular outer peripheral portion which is arranged on an outer side of the magnetic circuit housing unit; and plural arm portions which connect the magnetic circuit housing unit and the outer peripheral portion, wherein each of the plural arm portions has a sectional shape of a one-open-end shape having a connected end and an open end, and wherein the plural arm portions include an arm portion having the open end oriented to one direction and an arm portion having the open end oriented to a direction opposite to the one direction.

* * * * *